(12) United States Patent
Bayne

(10) Patent No.: US 7,068,925 B2
(45) Date of Patent: Jun. 27, 2006

(54) VERSATILE SEMI-TOROIDAL PROCESSING FURNACE WITH AUTOMATIC AND RECONFIGURABLE WAFER EXCHANGE

(75) Inventor: Christopher J. Bayne, Los Gatos, CA (US)

(73) Assignee: Diamond Semiconductor, Inc., Los Gatos, CA (US)

( * ) Notice: Subject to any disclaimer, the term of this patent is extended or adjusted under 35 U.S.C. 154(b) by 35 days.

(21) Appl. No.: 10/889,305

(22) Filed: Jul. 12, 2004

(65) Prior Publication Data

US 2006/0006164 A1    Jan. 12, 2006

(51) Int. Cl.
*F26B 19/00* (2006.01)

(52) U.S. Cl. .................. 392/416; 392/418; 219/390; 219/388; 219/405; 219/411; 118/724; 118/725; 118/50.1; 414/217; 165/133; 432/121

(58) Field of Classification Search ............... 219/390, 219/388, 393, 399, 405–407, 411; 392/416, 392/418; 118/724, 725, 50.1; 414/217; 165/133, DIG. 510; 432/121, 153; 250/492.2

See application file for complete search history.

(56) References Cited

U.S. PATENT DOCUMENTS 6,281,479 B1 * 8/2001 Guidotti et al. ............. 219/390
6,291,801 B1   9/2001 Guidotti et al.
6,672,819 B1 * 1/2004 Soraoka et al. ............. 414/217

OTHER PUBLICATIONS

Nerac Search, 1015237.048 Technical; Furnaces; CVD; Diffusion: Tubes; Wafer; Substrates, Peg Leahy, Feb. 12, 2002 (28 pages).

* cited by examiner

*Primary Examiner*—Shawntina Fuqua
(74) *Attorney, Agent, or Firm*—David B. Dort; Dort Partners IP PLLC

(57) ABSTRACT

The present invention comprises a fully automated, fabrication compliant furnace with the advantages of the horizontal and most of the advantages of the vertical furnace. One embodiment of the present invention is that it implements a multi-degree motion robot arm to move wafers from a loading area to a WIP station where the wafers are then loaded into wafer boats on a rotating cantilever system or directly onto a specialized and reconfigurable paddle designed to hold wafers. The wafers may be loaded in the horizontal processing position as well as the vertical processing position. Multiple levels of the semi-toroidal horizontal processors allow for multiple batches of wafers to be loaded, processed, cooled and unloaded by the robot arm.

The present invention reduces the footprint of the traditional horizontal or vertical furnaces, increases capacity and throughput, and allows for direct tube transfer.

21 Claims, 18 Drawing Sheets

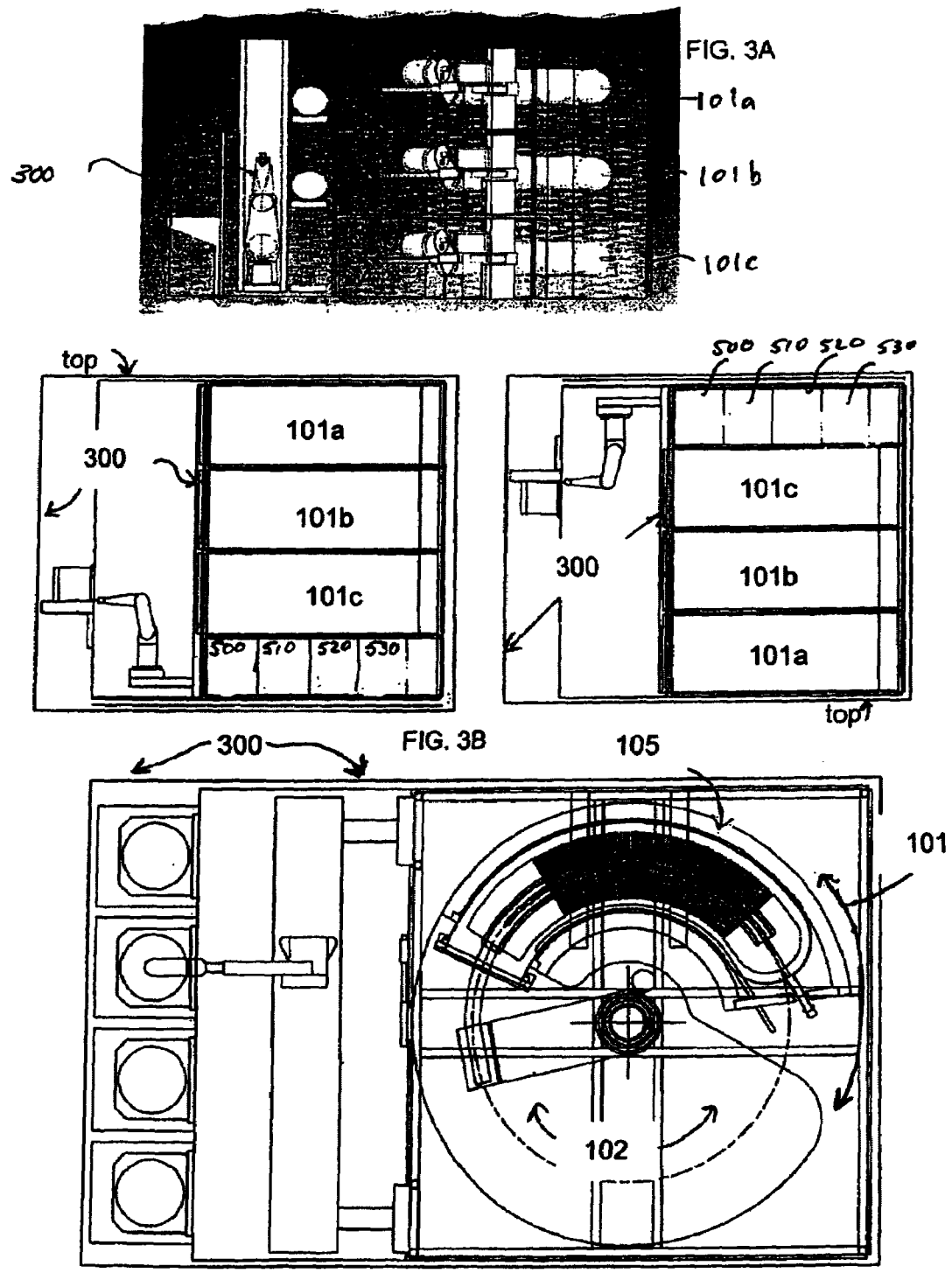

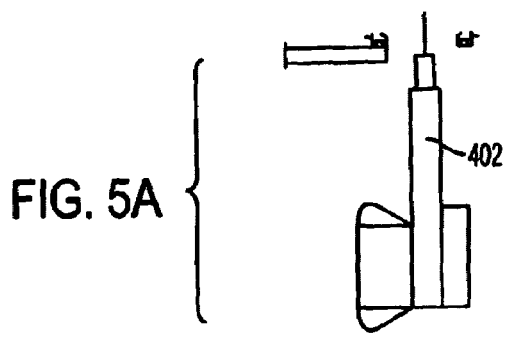
FIG. 5A
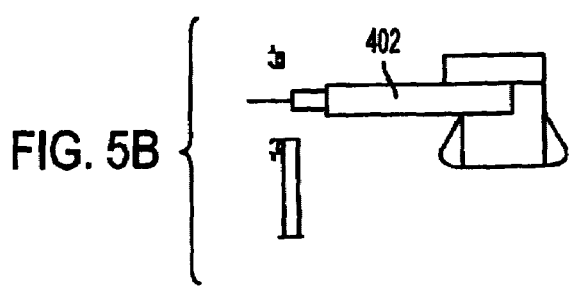
FIG. 5B
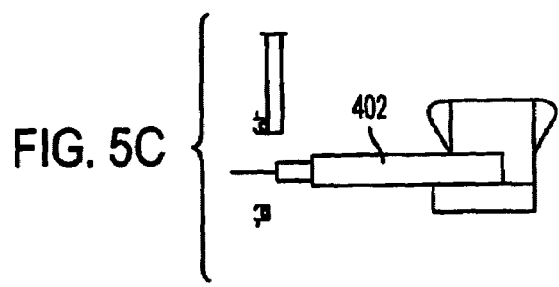
FIG. 5C
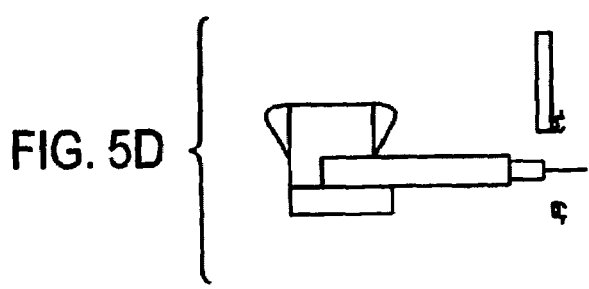
FIG. 5D
FIG. 5E
MOVEMENTS OF
ROBOT ARM 402
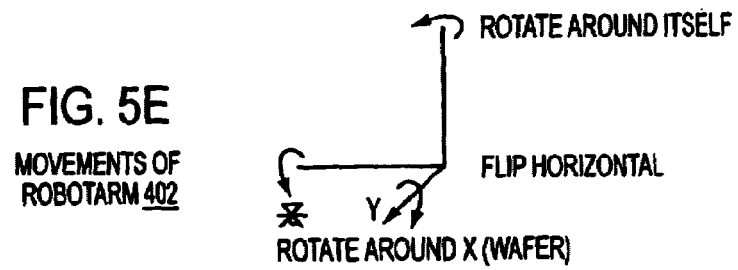

VERSATILE SEMI-TOROIDAL PROCESSING FURNACE WITH AUTOMATIC AND RECONFIGURABLE WAFER EXCHANGE

BACKGROUND

High-volume fabrication of semiconductors will reach a critical demand in the next few years. Throughput of wafer processing, and in particular, the costs associated with the development of each workpiece are critical for the survival of each semiconductor manufacturer. Additionally, because the price the end users are willing to pay for the semiconductors which are constantly being reduced, the cost associated with each wafer must be reduced as production increases.

Typically, the horizontal stack furnace, as shown as prior art FIG. 1A, has served reasonably well in the thermal processing of wafers. In the horizontal stack furnace, wafers are thermally processed by various methods, including lamps, resistance heated coils, and other methods. Horizontal stack ovens are problematic in that they require more mechanical or manual loading and unloading movements, each of which may result in contamination or the loss of an entire wafer boat. Furthermore, uniform thermal distribution is more difficult in the horizontal stack oven than in other oven configurations. The horizontal stack oven also has resulted in poor environmental control of the wafer environment.

A solution for poor environmental control of the horizontal stack has been the use of the vertical processing furnace as shown in prior art FIG. 1B (ASM), which allows for the improved processing of wafers with regard to contamination. However, vertical processing has a particularly problematic limitation in that the wafers must be supported to maintain a perfect wafer shape.

In the future, all tools may require full automation as well as full SMIF and FOUP compatibility. All tools should integrate the factory host automation system. Additionally, the market shift from 200 mm to 300 mm wafers will require retooling. However, in some sectors certain applications remain more economical at 200 mm.

The currently installed base of horizontal furnaces will be gradually phased out and replaced with automated furnaces. For economic reasons, fabrication labs will take advantage of the benefits of each type of the processing tool on an application-specific basis. Instead of using just one type of furnace, regardless of the application, furnaces will be matched to the processes for which they are most suited. For example, mini-batch furnaces might be used for exotic chemical vapor deposition processes and vertical furnaces will be used for all generic LPCVD processes.

Not all device technology demands particle control or processing that is provided by the expensive vertical furnace. Therefore, not all wafer processing justifies the cost of vertical furnace. For example, smaller chips, such as transistors, thyristors and side-actors will use large line widths and single wafer tools will be used for rapid thermal process.

However, continuing the diffusion processes with the traditional horizontal stack furnaces is not feasible; this is because the support and development of these furnaces is subsiding. When wafer circuit geometries shrink or reliability issues become a serious cost factor, options are limited for wafer processors. In-line horizontal furnaces cannot be the system of choice for future fabs because they are difficult to fully automate and increases the investment to support existing horizontal furnaces. It is also clear that the vertical furnaces are not always a viable economic option leaving a large gap in the market. Horizontal furnaces have the advantage that wafers are processed "on edge" standing vertically, whereas the vertical furnace operates with the wafers lying horizontally, limiting the throughput and higher temperature capabilities.

Some of these problems have been partially addressed in U.S. Pat. Nos. 6,281,479 and 6,291,801 to Guidotti, and currently assigned to International Business Machines of Armonk, N.Y., which are hereby incorporated by reference. The Guidoitti disclosures teach a workpiece processing system in which the thermal processing is performed in a semicircular toroidal oven and which is shown in prior art FIG. 2. While the Guidotti teachings offer some advantage over the conventional fabrication ovens which provides a somewhat reduced footprint, they fail to provide advantages of increased throughput and future automation requirements.

SUMMARY PARTICULAR EMBODIMENTS OF THE INVENTION

One embodiment of the present invention is a fully automated, semi-circular, fabrication compliant furnace, known by the trade name TORO™, which has the advantages of the horizontal, as well as most of the advantages of the vertical furnace. The vertical oven doesn't allow the 1200C-plus temperatures that TORO™ allows. Another advantage of TORO™ is its ability to also process the wafer lying horizontally if required.

When comparing the traditional in-line horizontal three or four stack to the TORO™ semicircular wafer processing system, it is clear that particular embodiments of the invention provides many advantages. One of the key features is that one embodiment of the present invention is already compliant and compatible with future fabrication standards, whereas the traditional in-line horizontal is not likely to be adaptable. The TORO™ allows for direct tube to tube transfer, which is not the case in the traditional in-line horizontal.

One aspect of the present invention is that it implements a multi-degree motion robot arm to move wafers from a loading area to a WIP station. The wafers are then loaded into wafer boats on a rotating cantilever system or directly onto a specialized and reconfigurable paddle designed to hold wafers. The wafers may be loaded in the horizontal processing position as well as in the vertical processing position.

A comparison of a horizontal three or four stack furnace which permits the vertical processing of wafers shows that the TORO™ semicircular furnace provides advantages in almost every area of cost reduction and throughput increase. For example, the footprint of the vertical furnace tube is over three times that of the TORO™. The TORO™ is able to double the wafer throughput of a vertical furnace and allows for direct tube to tube transfer, which is generally not available in the vertical oven.

BRIEF DESCRIPTION OF THE DRAWINGS

Particular embodiments of the present invention can be better understood by reference to the following exemplary illustrations in which:

FIG. 3A shows the implementation of one embodiment of the present invention in a fabrication environment from a frontal-angled perspective;

FIG. 3B shows one embodiment of the invention from a top and bottom side view:

FIG. 3C is a detailed top view perspective of one embodiment of the present invention;

FIGS. 5A–E show a sample of four distinct motions of the loading arm in loading a wafer which is loaded is then processed in the vertical position;

DETAILED DESCRIPTION OF THE DRAWINGS

Figure 1A:
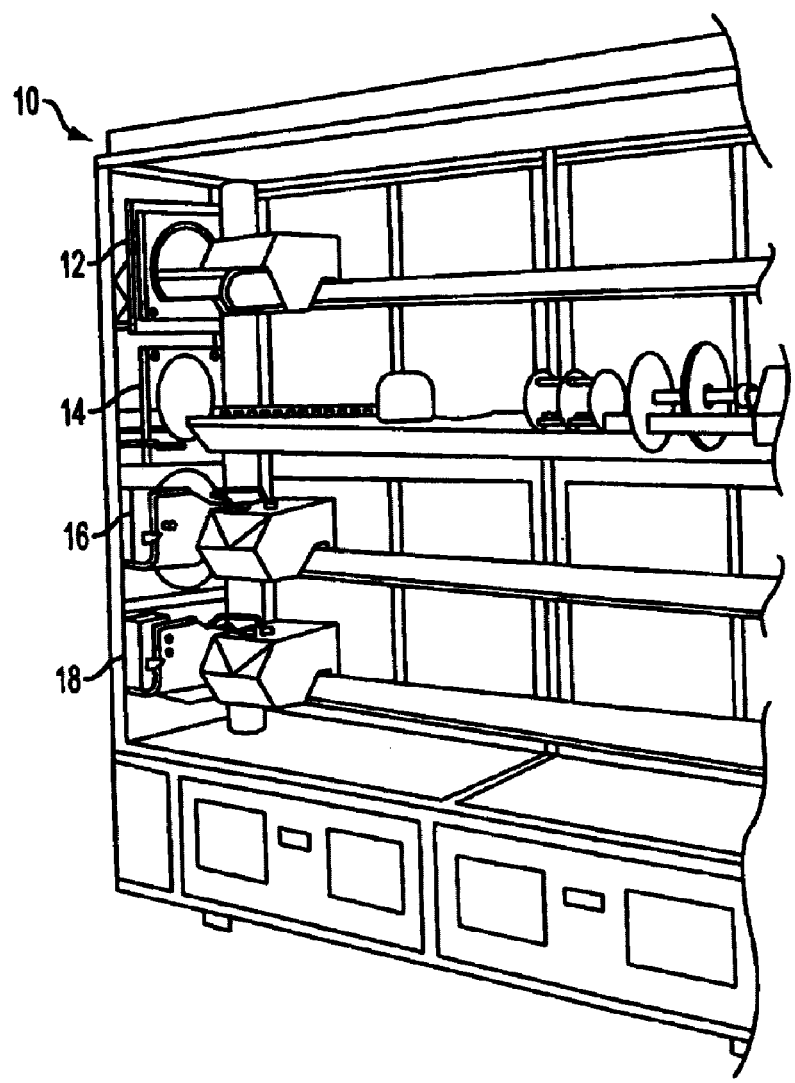
FIG. 1A illustrates a sample prior art quad stack horizontal wafer processing oven.
Figure 1B:
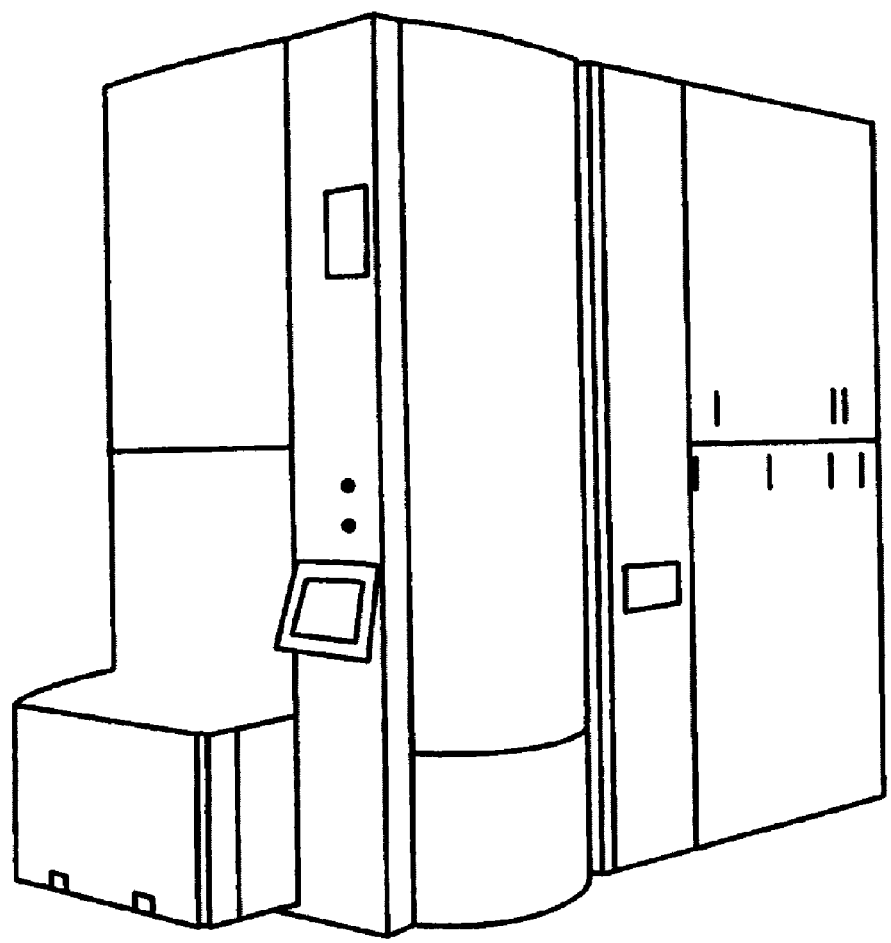
FIG. 1B illustrates a sample prior art vertical wafer processing oven.
Figure 2:
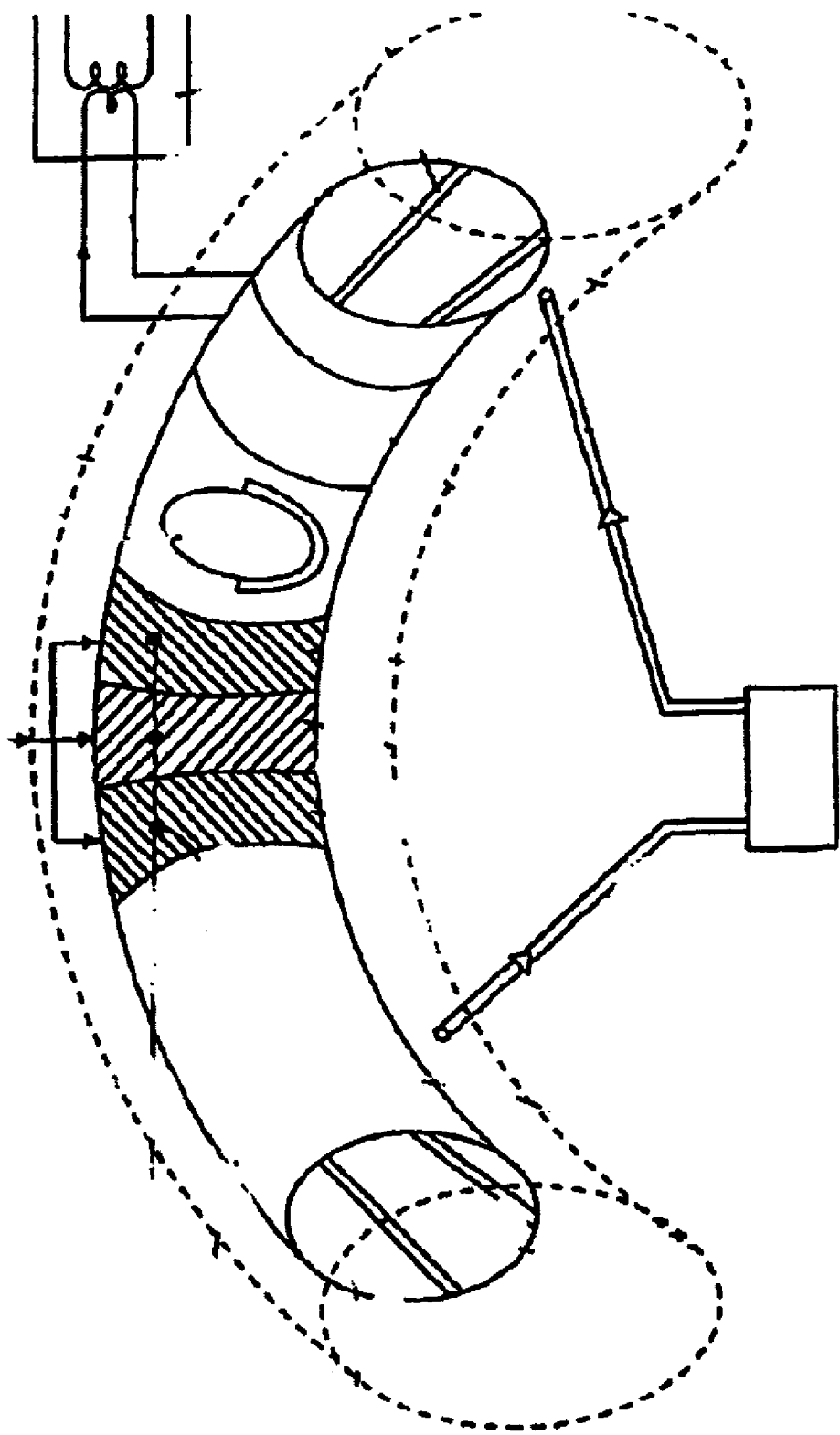
FIG. 2 illustrates a sample toroidal-shaped wafer processing oven in the prior art.

The following descriptions are meant to be exemplary and should not be viewed as necessarily limiting the invention to the particular structures described or their geometries. Variations in function, structure and geometry can be implemented to suit the needs of the particular fabrication area without departing from the scope of the invention.

FIGS. 3A, 3B, and 3C, cutaway, side, and top views of one embodiment of the present invention respectively, are shown as this embodiment which may be implemented in the fabrication lab. FIG. 3B shows three stacked processors 101a, 101b, 101c, the loading system 300, the control system 500 and individual tube controllers 510, 520 and 530, all of which will be described in detail below. In reference to FIG. 3C, a top view of the integrated wafer processing system 101, shows a loading section 300, a wafer handling portion 102, a wafer processing section 105.

Figure 4B:
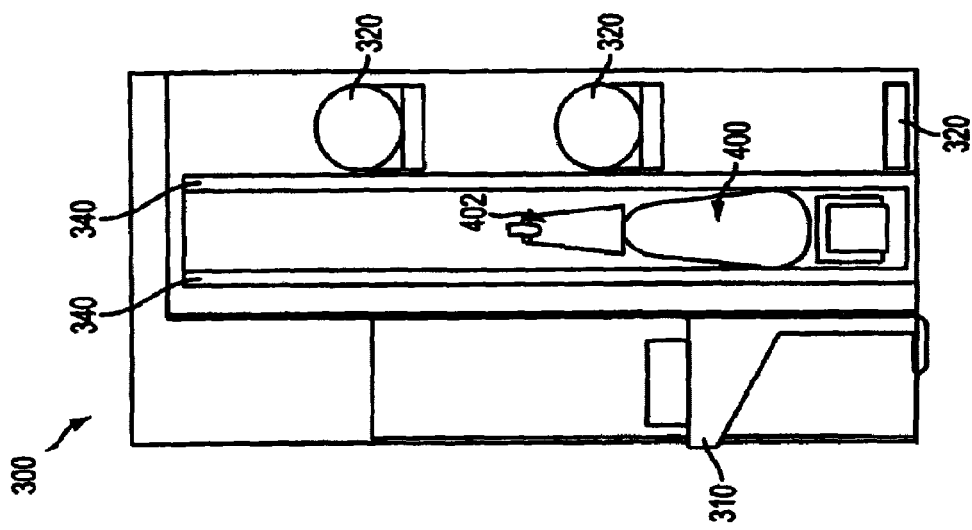
FIGS. 4A–B illustrates the wafer loading system in greater detail, from front and side cutaway views respectively.
Figure 4A:
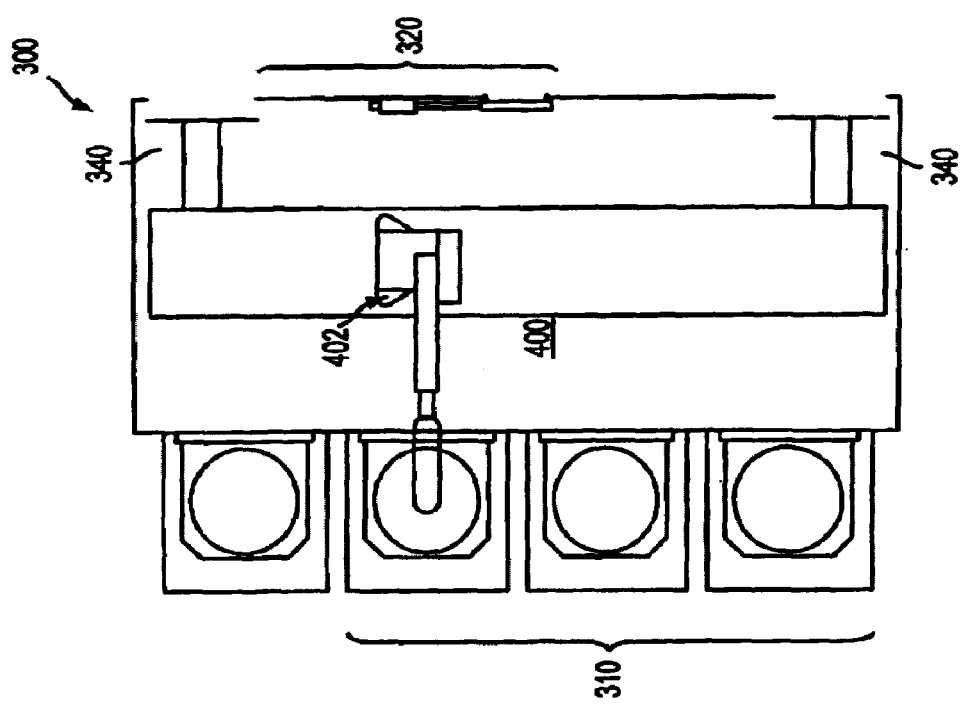

Referring now to FIGS. 4A–B, the wafer loading system 300 is shown from the top and side different perspectives, respectively. FIG. 4B illustrates the main structures from a cutaway which include a vertical wafer storage 310 and horizontal or temporary wafer storage 320 (WIP storage), which can move vertically on a vertical rail system 340. A robot arm system 400 includes a loading arm capable of multi-degree motion (robot arm or loading arm) 402. The robot arm 402 is an RX90 model by Staubli, the specifications of which are available from this company and which are hereby incorporated by reference for purposes of implementation. The robot arm can be controlled by an internal controlling system 400 and/or the processor control system 500. The processor control system 500 is responsible for the loading and unloading of wafers into the WIP storage area 320 and into the processing oven 101 from the vertical storage area 310. As can be appreciated, other types of robot arms, made by other manufacturers would be able to perform the required functionality for implementing one embodiment of the present invention.

The operation of the loading system 300 may be somewhat varied which is dependent on the needs of the end user. In general, a SMIF or FOUP storage container (herein "external carrier") (not labeled) is loaded manually or semi-automatically into the wafer loading system 300 and then into the vertical storage area 310. In a preferred embodiment, the loading arm (robot arm) 402 retracts the wafers from the carrier and rotates the wafer from the horizontal to the vertical position (FIGS. 5A and 5B, respectively). The loading arm 402 rotates about its own axis in the x and z planes (FIGS. 5C and 5D), and is carried by the track system 340 (if necessary) which includes a Cartesian elevator (not shown) for movement in two dimensions, such that the wafer is placed into a "load" position in the loading or WIP area 320.

Greater detail of the multi-degree movement robot loading arm 402 is shown in FIG. 5E. The multi-dimensional loading arm 402 is shown in a first position, ready to load wafers out of the carrier in the vertical storage area 310, one-by-one into the WIP staging area 320.

Figure 6:
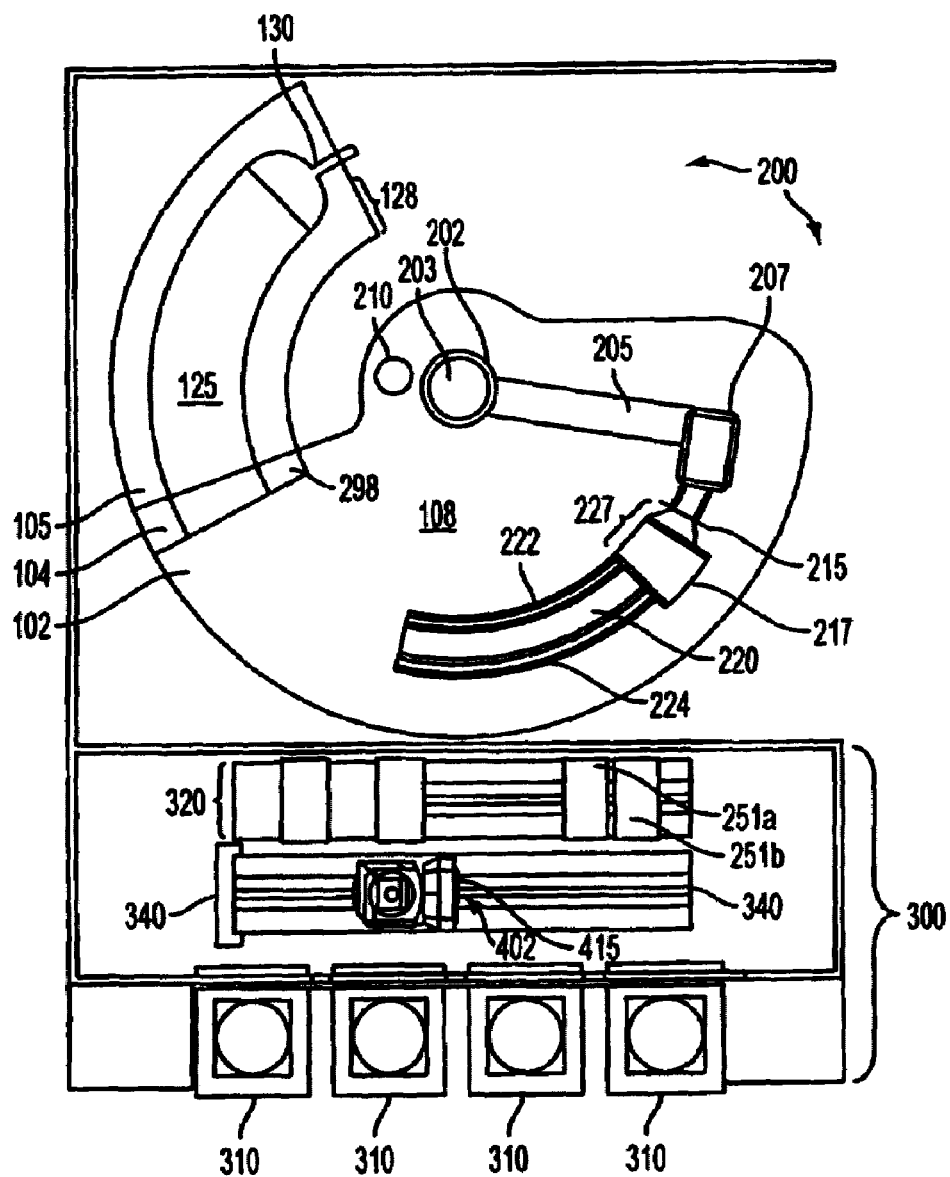
FIG. 6 illustrates a detailed sectional top view of the improved semi-toroidal wafer processing system in a single section.

Now referring to FIG. 6, a detailed top view of a preferred embodiment of the semi-toroidal wafer processing system (known by the trade name TORO™) 101 is shown. A thermal processing section or processor 101(a) includes a first semicircular section 102 which houses the main or internal wafer handling and distribution system or cantilever loading system 200. The semicircular section 102 generally runs between 130 and 200 degrees of arc, depending on the installation needs of the end user. The rotation system 200 runs along the exterior arc of the first semicircular processing section 102. A central rotation axle or axis 202 is encased in an optional bearing ring 203. The axle 202 may be common to more than one of the first semicircular sections (see FIG. 10A) but has independent motion. The central axle 202 is connected to the rotation or pivot (cantilever) arm 205.

In addition, the axle 202 is attached to a hydraulic, mechanical or electric type of motor 210 which not only can rotate the cantilever system 200, but can also raise and lower the pivot arm 205 as needed for the proper loading and unloading of the wafers. The pivot or cantilever arm 205, is attached to a head 207, which is fastened to securing structure 227 which is an "open jaw" in a preferred embodiment, which is in turn attached either directly or indirectly to a paddle 220, described below. The cantilever system 200 also includes several structures to provide environmental security, which includes a purge door or lock 215 used to secure the purge area and to allow effluent run out into the exhaust area 104 (described below) and a thermal plug 217 which is used for thermally securing the oven 105.

The thermal processing section 105 comprises a semi-toroidal arc section 110 that is volumetrically connected to the first semicircular section 102 at the processing end and houses the arc-shaped thermal processing (wafer cooking) tube 125. The thermal processing tube 125, in turn, is volumetrically connected to the purified gas flow 130 through the processor barrier 128. The wafer cooking tube 125 provides space for the customized "wafer boats" (not shown) and/or segmented paddles 220 that are typically able to hold up to 50 wafers and are made of silicon quartz, silicon carbide or other type of material that is generally able to handle the 1200-plus temperature of wafer processing. In addition, the thermal processing oven 125, TORO™ includes thermal elements (not shown) designed to provide isothermal temperatures conditions throughout the "flat-zone."

The support or loading cantilever arm 205 swings the along the interior of the outer wall of the semicircular section 102. The wedge-shaped region 104 in which the first semicircular section 102 and the processing tube 125 overlap is the exhaust purge 298 or scavenger section or box 104. The exhaust purge 298 is located in the volumetric space in which the toxic gas buildup may be expelled from the processing system 105.

Also shown in FIG. 6, a first wafer is placed in a "slot" of the optional first wafer boat 251a in the WIP station 320. The process is repeated until all the wafers in the batch have been properly placed into boats. A batch is typically 4–6 wafer boats of 50 wafers each.

The end effector 415 on the handling arm 402 switches from that which is used for the single wafer transfer to the one that is used for picking up the "tunnel" or specialized wafer boat. The handling arm 402 picks up the last wafer boat 251(b) and places it on the cantilever or paddle 220. The typical wafer boat is cylindrical in shape for use in the quad stack oven. Customized wafer boats may provide for better functionality in one embodiment of the present invention. Alternatively, the robot arm 402 directly places the wafer into wafer slots 222 and 224 on the paddle 220 as described below.

The paddle 220 containing the wafers (with or without the optional wafer boat) is controlled by the controller(s) (FIG. 3B, references 500–530) to "rotate" or move towards the furnace 105 by one "boat" or wafer length, as will be described below (and shown in FIGS. 7–9). The handling/robot arm 402, then moves the second boat into position on the paddle 220 of the cantilever or rotation system 201. The process is completed until all of the boats are loaded onto the paddle 220 of the cantilever or rotation system 201. TORO™ has a purge chamber 105 which facilitates the load and unload of the wafers from the "flat-zone" without exposure to atmosphere.

When the particular batch of wafers has been thermally processed, the rotation system 201 reverses the process described above. The last wafer boat on the paddle 220 is rotated out of the thermal processor 125 and loaded into the WIP area 320 by the robot arm 402 so that they may be cooled. The placement of the wafer from the WIP area 320 back into the carrier 301 is most like the reverse motion of the robot arm 402, but is not required.

Other structural features of the furnace 101 include that the semi-toroidal part between 60 and 130 degrees of arc, although this is not required. The semicircular portion is generally between 120 and 200 degrees of arc. The semicircular portion and semi-toroidal portion, generally volumetrically overlap each other between 5 and 20 degree of arc to create the scavenger or exhaust purge 104.

Figure 7:
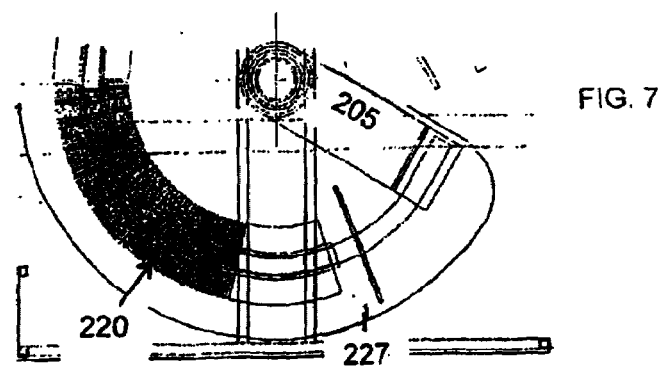
FIG. 7 illustrates a first or initial position of the cantilever in a loading position.
Figure 8:
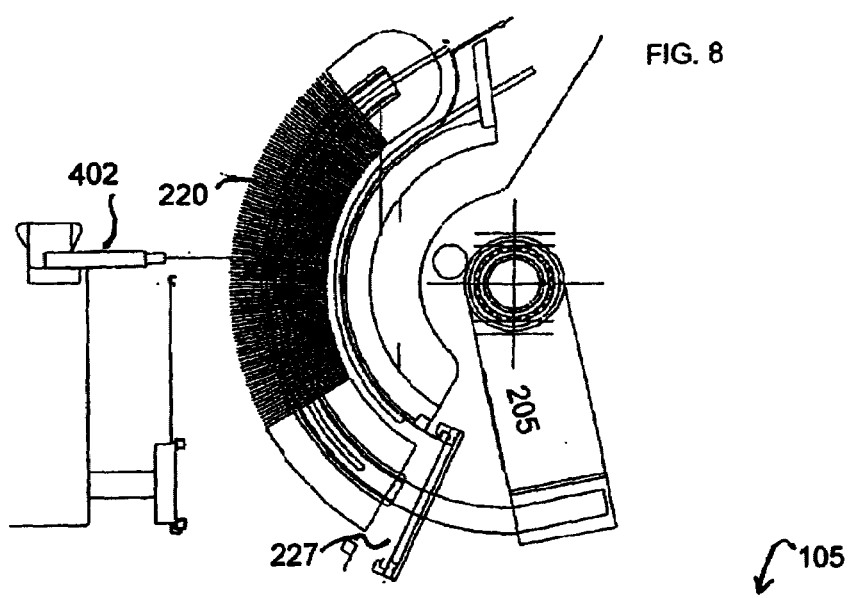
FIG. 8 illustrates a second or partially-rotated and partially-loaded position of the cantilever.

Referring now to FIG. 7 a more detailed perspective of the wafer movement or internal handling system—(not labeled) is shown in a first or unloaded position. For purposes of illustration, the wafers are shown as loaded in the multiple wafer boats 251(a), 251(b), 251(c) and secured on the paddle 220 in a vertically-stored radial configuration which is the preferred embodiment. However, other configurations also provide particular advantages and the wafer boats 251(a) . . . are optional as the paddle 220 may also be configured to directly hold the wafers for processing, which is shown below in FIGS. 12A and B.

The rotation arm 205 is mechanically connected to a paddle grasping structure 227 which is an "open jaw" capable of attaching itself to the paddle 220. An optional guide (not labeled) allows for easy lifting and rotation of the wafers. It is also contemplated that the axle 202 will have to lift and lower the wafers from fractions of an inch to several inches depending on the particular installation required by the end user. A second or partially loaded position is shown in FIG. 8, in which the wafers are being placed in a position near the middle of the paddle 220.

Figure 9:
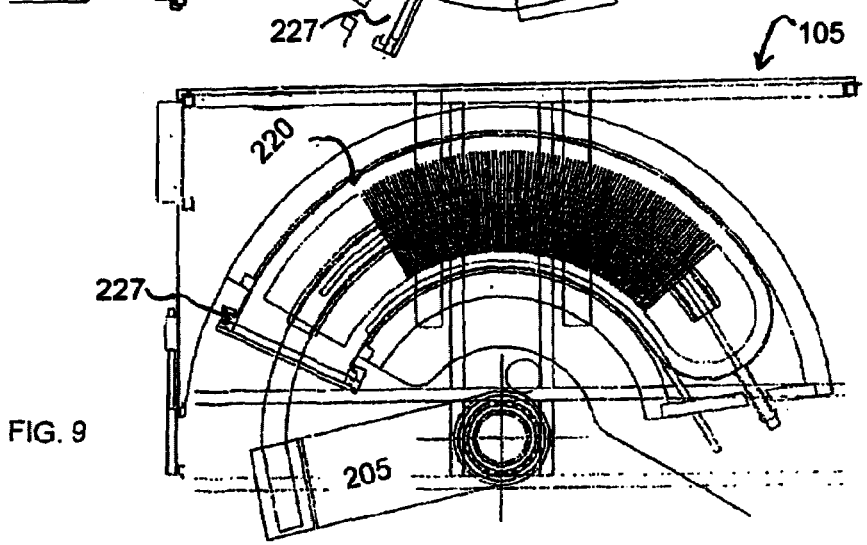
FIG. 9 illustrates a third or loaded position of the rotation arm or cantilever.

Referring now to FIG. 9, a detailed perspective of the internal wafer handling or cantilever system 230 in a third or fully loaded position is shown. The paddle 220 with the wafer boats 251(a), . . . , is completely loaded in the processing tube 125, and a portion of the loading system 230, including the open jaw 227. The thermal plug 217 is located in the processing tube 125 and the scavenger door (not labeled) allows effluent to enter the scavenger space 104.

Figure 10A:
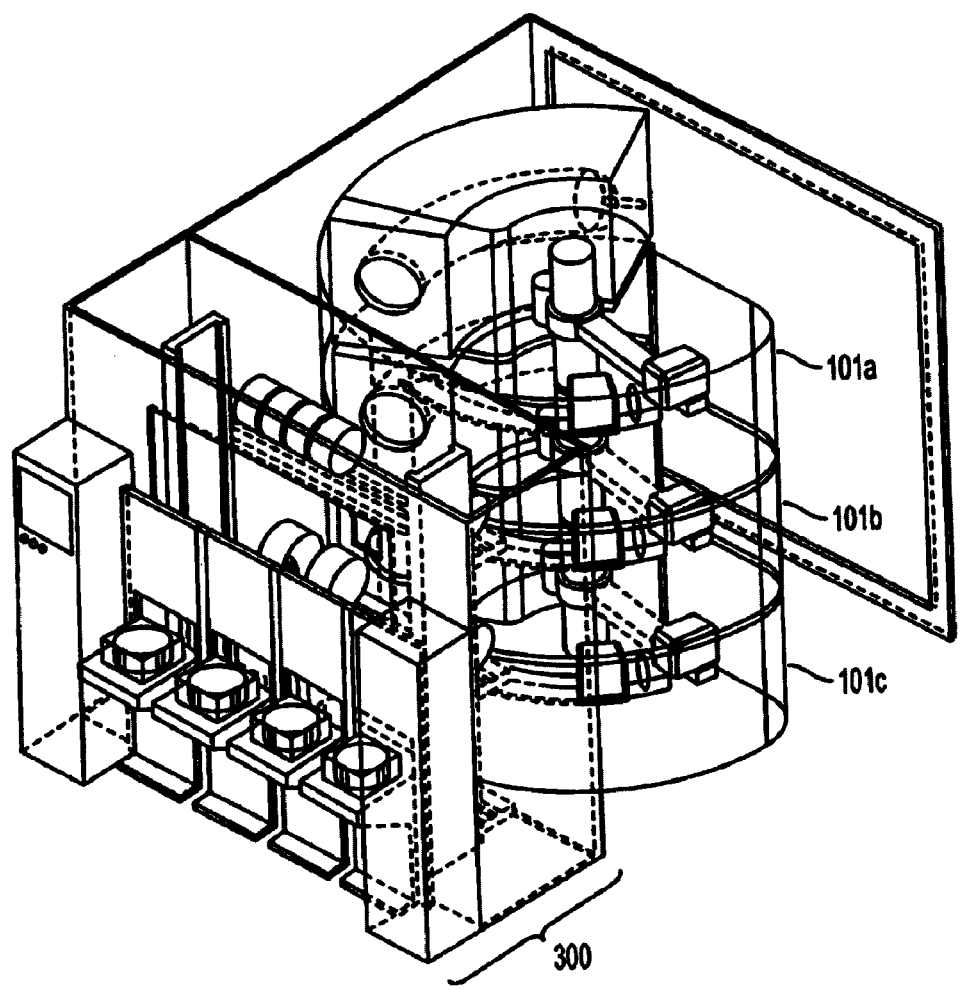
FIG. 10A shows one embodiment of the present invention from a side view in a stacked embodiment, along with the tube transfer or loading system.
Figure 10B:
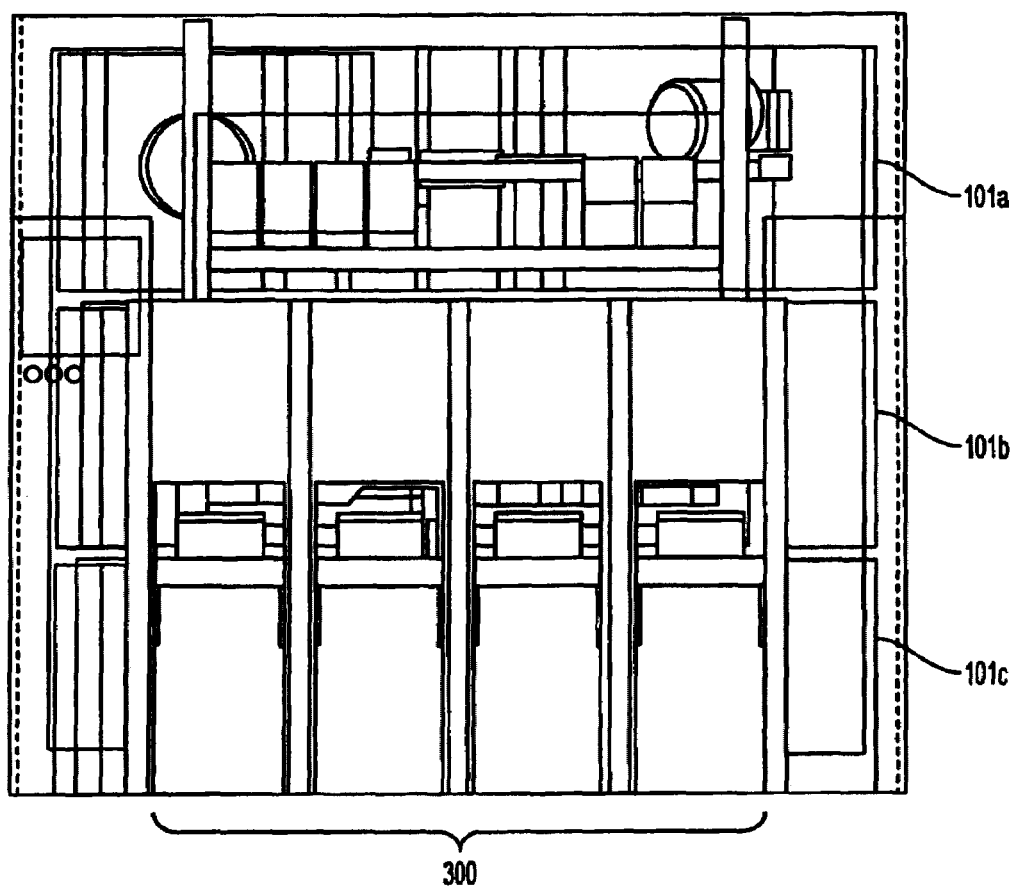
FIG. 10B shows one embodiment of the present invention from a front view in a stacked embodiment, along with the carrier transfer or loading system.

One of the advantages provided by the automatic loading system 300 in combination with the semi-toroidal processing system 101 is that processed may be run simultaneously at staggered times. This is because of the preferred embodiment in which 3 or 4 processing ovens 101 are stacked vertically. Referring now to FIG. 10A, a stack of three semi-toroidal processing systems 101(a), 101(b), 101(c) is shown from an angled top view. It is also anticipated that other numbers of processing ovens may be stacked as well, depending on the space and throughput needs of end user. Barriers(not labeled), are placed between each stackable processor system 101(a), 101(b), thus preventing environmental contamination. The central rotation axle or axis 202m, may have a common connection to more than one of the first semicircular sections, but each axis 202a, 202b has an independent motion rotation and vertical movement, so that all the ovens 101a, 101b, and 101c can be used simultaneously for different wafer processing stages to the advantage of the user. A frontal view of the loading area 300 is shown in FIG. 10B with the sample configuration of the horizontally-stacked processors 101(a) and 101(b), seen rising behind the loading area.

Figure 11:
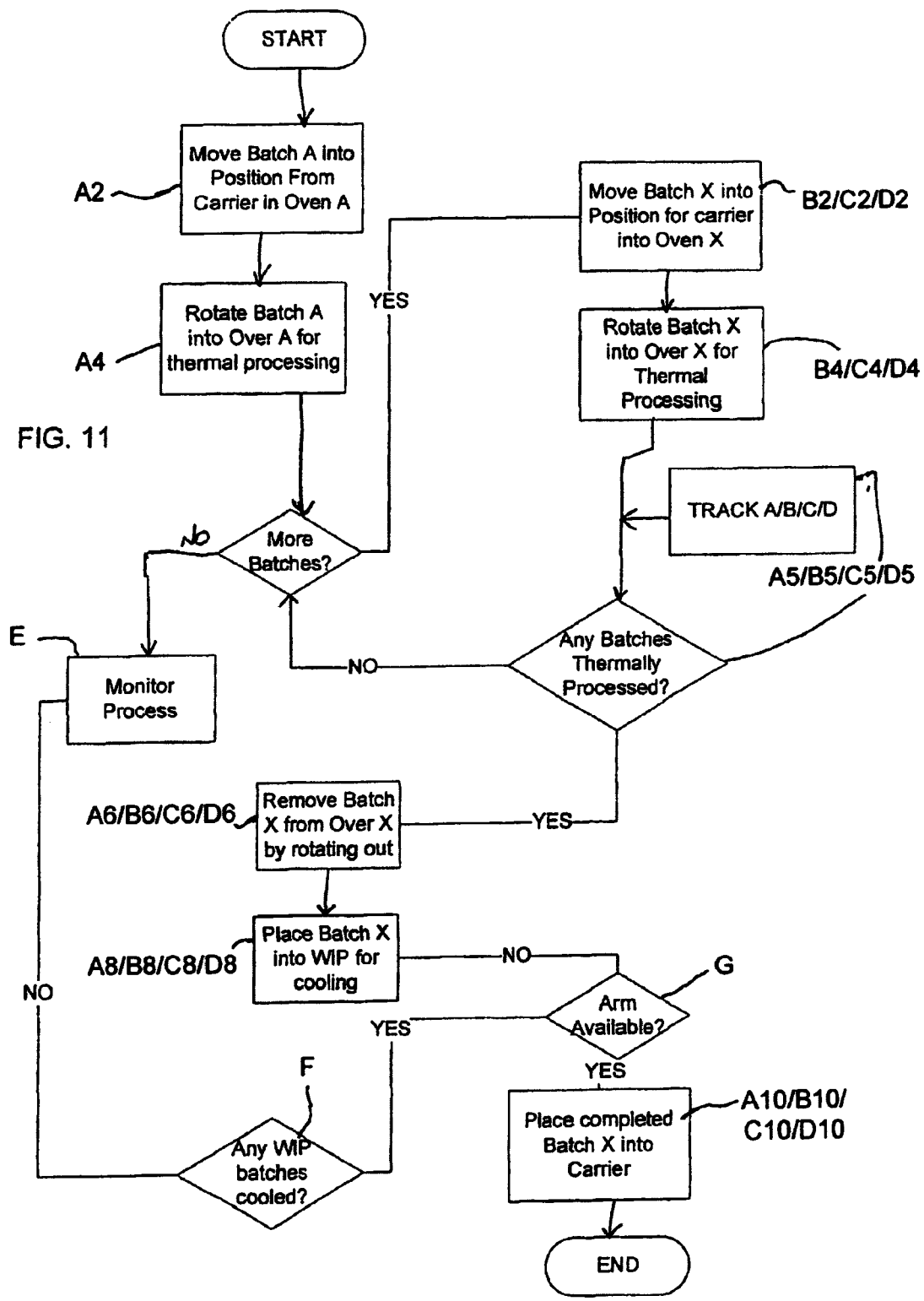
FIG. 11 is a flowchart showing staggered processing with one embodiment of the present invention.

The flowchart representing FIG. 11 describes some of the basic aspects of the simultaneously staggered processing involved in one embodiment of the present invention. In step A, the system determines either automatically through a scheduling program or is programmed manually through the controller system (not shown, see FIG. 3A, reference 500 above) how the wafers are to be processed in each tube of furnace 101. In step B, one or more wafer carriers (SMIF and FOUP) are loaded into the vertical storage unit. In step A2, the programmable and/or controllable robot arm (see FIG.

4B, reference 402) loads a first batch of wafers individually to a vertical position to a wafer holder located on the first cantilever system. The movements required of the robot arm to complete step A2 are described above in FIGS. 5A–D. In step A4, the cantilever system is rotated to place the first wafer holder in a first thermal processing oven so that the first batch of wafers can be thermally processed. As soon as the first batch of wafers is loaded into the first oven in step B2, the robot arm is used to load a second batch of wafers to a second vertical position inside a second wafer holder located on a second cantilever system. The motions involved in B2 are similar to those involved in A2 and described in FIGS. 5A–D above, except that the track system (see FIG. 4B, reference 340) will move the robot arm to a different vertical position and a different processing oven. In step B4, the second cantilever system places the wafer holder of the second oven in the second purged thermal processing oven, so that the second batch of wafers may be processed.

In step A6, and during such time that said second batch of wafers is being thermally processed, if appropriate, the first batch of wafers in the first oven is rotated out by the first cantilever system. In step A8, the first batch of wafers is placed into an intermediate storage or WIP area so that they may be cooled and wait to be re-loaded into the carriers in step A10, as soon as the robot arm becomes available. Similarly, a third or fourth batch of wafers may be processed in a similar "staggered" fashion as the first and second batches above. Thus, the second batch of wafers may be completed and removed from the second oven in step B6 and placed into WIP in step B8 while the third batch is being thermally processed in the third processing oven.

Figure 12A:
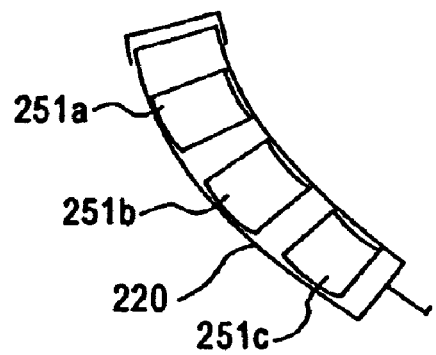
FIG. 12A shows a detail of the carrier or paddle with the wafer boats placed in a semicircular radial configuration.

FIG. 12A shows the detail of a paddle 220 configured for holding multiple wafer boats 251(a), 251(b), etc., as shown in the above drawings.

Figure 12B:
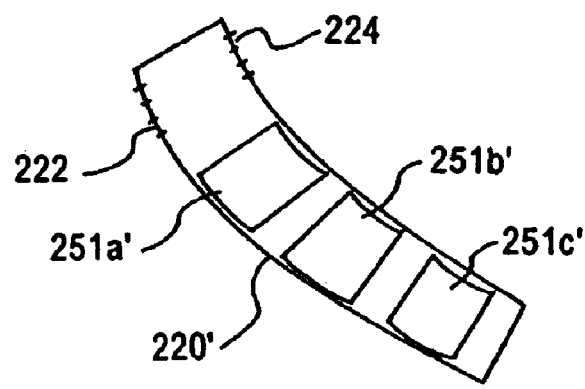
FIG. 12B shows a shape variation of the paddle for holding standard wafer boats.
Figure 13A:
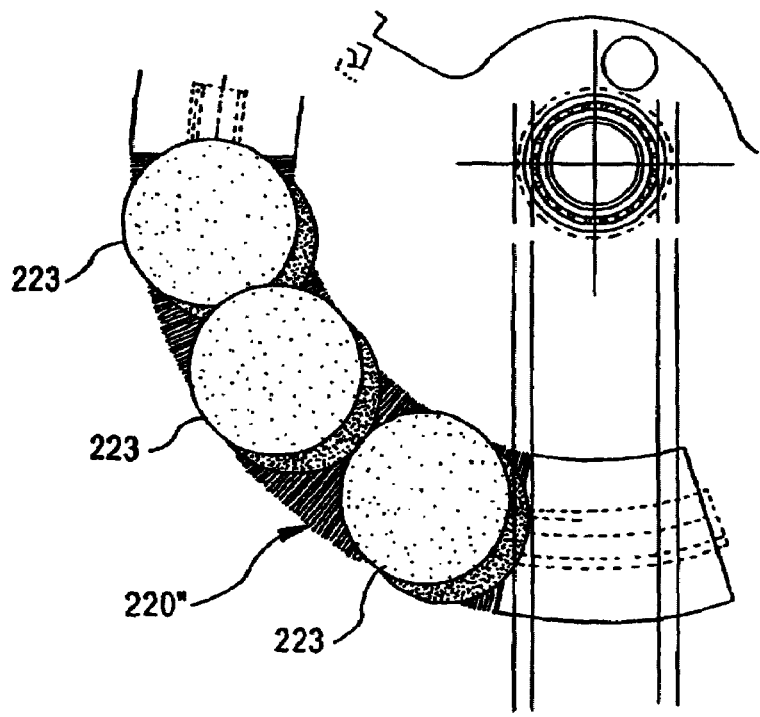
FIGS. 13A–B show a second alternate type of carrier of paddle with loaded wafers from a top and side view respectively for horizontal processing of wafer.
Figure 13B:
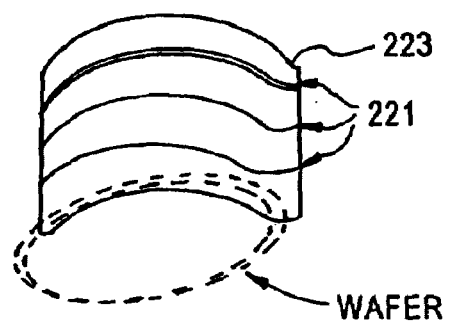

Referring now to FIG. 12B, the detail of the specialized carrier or paddle 220 is shown. The paddle 220 can be made as an interchangeable part allowing for alternate processing types in the same thermal wafer processing tube 105. However, as shown in a preferred embodiment, the paddle 220 is made of a material that can withstand temperatures of about 1200 degree Centigrade and include quartz and silicon carbide. The paddle 220 is configured for carrying either custom configured or standard wafer boats 251(a), 251(b), 251(c) which are secured by slots or notches at the top end 222 and bottom end 224, such that the wafers are properly separated, but also economically positioned.

FIGS. 13–19 illustrate some of the versatile features of TORO™ and its components that provide additional economic, reduced footprint and throughput advantages over the prior art. For example, not only does the multi-dimensional loading arm 402 and controlling system 500 allow each oven 101a, 101b, . . . to be used simultaneously while in different stages of processing, it is also possible to simultaneously run different types of wafer processing in different processors in the stack.

Although in a preferred embodiment, the invention contemplates the horizontal thermal processing of vertically held wafers in the stacks, wafers can be processed by TORO™ in both the horizontal and vertical batch processing simultaneously. For example, FIGS. 13A and B show an alternate and optionally interchangeable paddle 220" in which the wafers are loaded such that they are processed in a horizontal position in the purge chamber 125. The paddle 220" is shown from top and cutaway side positions, respectively. The horizontal fastening structures 223 include horizontal supports 221 for supporting the wafer for horizontal processing. The horizontal structures may also take the form of removable or permanent wafer boats in an optional alternate embodiment.

Figure 14A:
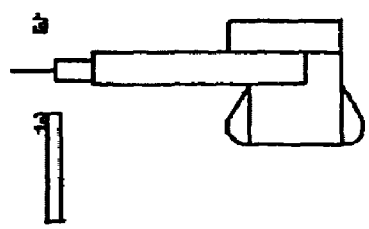
FIGS. 14A–D show a sample of four motions of the loading arm in loading a wafer to be processed in the vertical position.
Figure 14B:
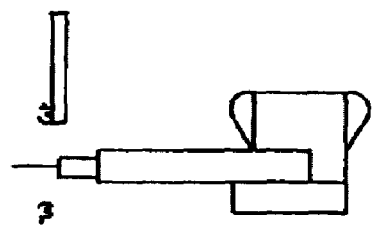
Figure 14C:
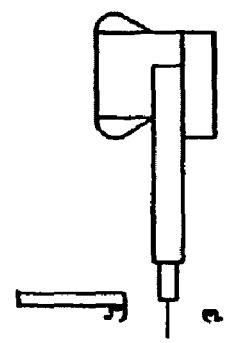
Figure 14D:
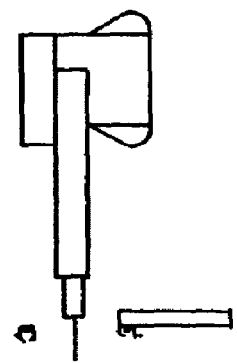

FIGS. 14A–D show loading arm 402' movements in the multiple-axis motion as may be required of one embodiment of the present invention. For example, if the wafers are to be processed in a horizontal position (vertical over), the loading arm 400 would place the wafers in a "stack" on the paddle (not shown) by using two motions a "lift" (FIG. 14A) and "twist" (FIG. 14B), "swing" (FIG. 14C) and "push" (FIG. 14D). These motions are shown to be illustrative only and the skilled artisan will be able to appreciate the versatility of one embodiment of the present invention through the addition of the loading arm's versatility to place the wafer(s) into several different positions. However, the robot arm 402 may be manipulated in other movements which would perform the necessary motions in an economical manner and the motions are meant to be illustrative and not limiting.

Figure 15:
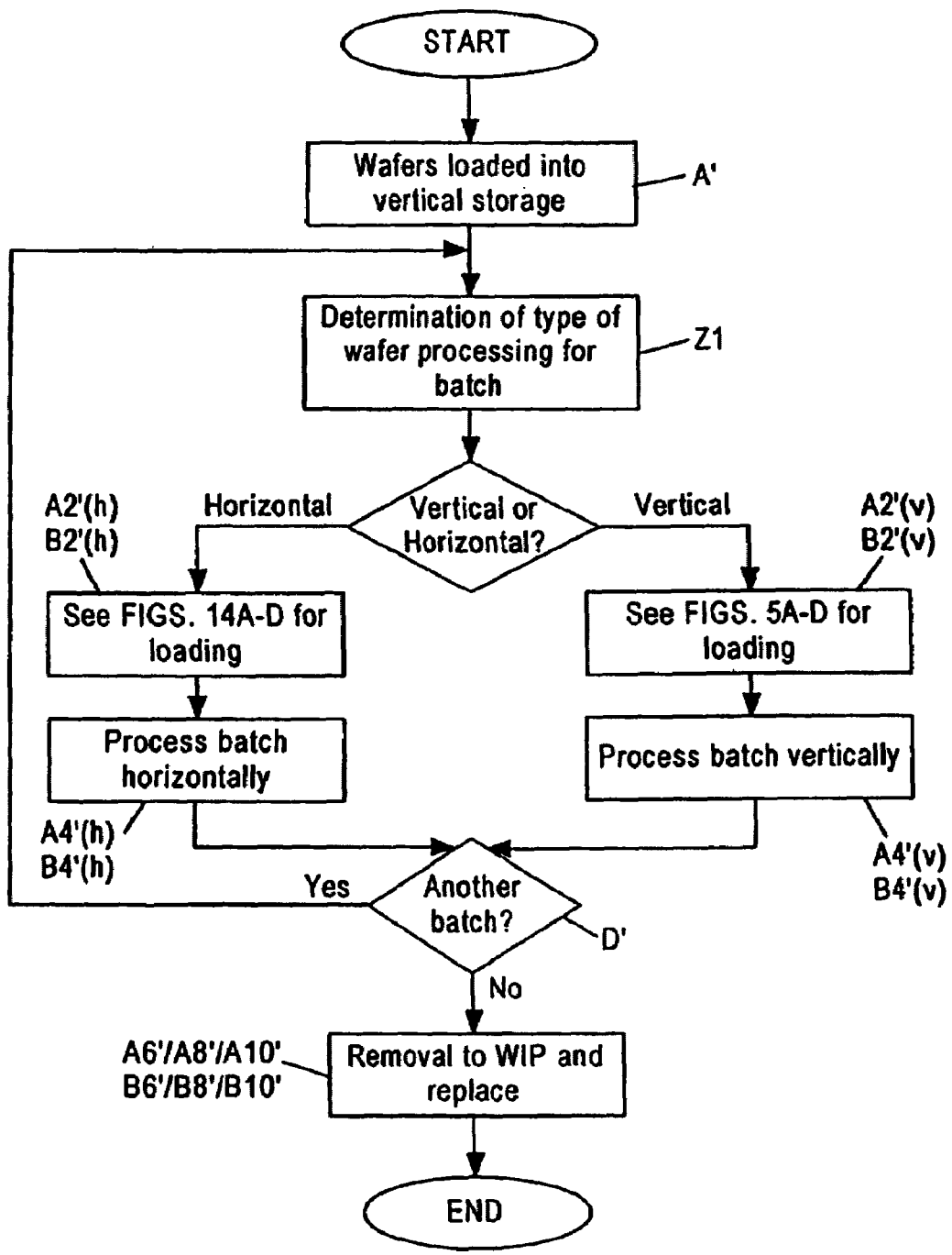
FIG. 15 is a flowchart that includes horizontal wafer processing with one embodiment of the present invention.

If the wafers are to be processed laying down horizontally in the TORO, the robot is programmed accordingly and appropriate boats, such as those shown in FIGS. 14A and B are used. The flowchart representing FIG. 15 describes some of the alternate processing aspects of the staggered processing involved in one embodiment of the present invention. Although the process outlined by the flowchart in FIG. 15 is similar to FIG. 11, an important distinction between the two processes is that the process in FIG. 15 must allow for either vertical or horizontal processing. In step A', the system determines either automatically through a scheduling program, or is programmed manually through the controller system, how the wafers are to be processed in each tube of furnace. In step B', one or more wafer carriers (SMIF and FOUP) are loaded into the vertical storage unit. In step Z1, the system is informed either automatically (possibly at Step A') or through another technique, such as manual programming, scheduling or RF communication so that this particular batch will be processed either horizontally or vertically. In step A2', the programmable and/or controllable robot arm loads the first batch of wafers individually to either a vertical or horizontal position to a wafer holder located on the first cantilever system. The movements required of the robot arm to complete step A2' are dependent on the determination completed in step Z1 as to whether the particular batch is to be processed vertically or horizontally. As soon as the first batch of wafers is loaded into the first oven, a second determination step Z2 is completed before proceeding to step the loading step in B2'. In step B2', the robot arm is used to load a second batch of wafers to either a vertical or horizontal position onto a second wafer holder located on a second cantilever system.

Figure 17:
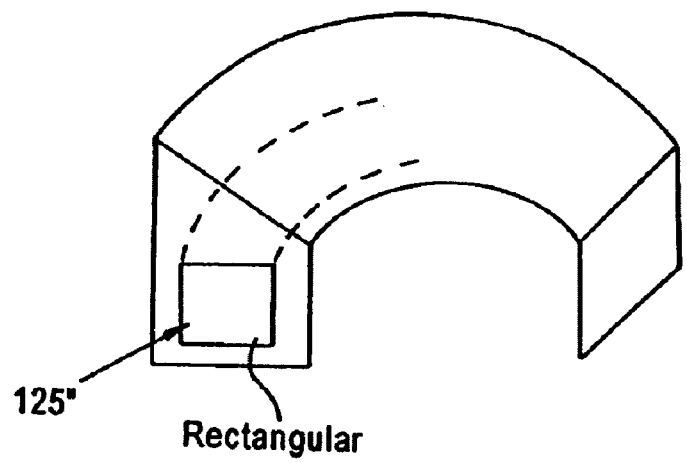
FIG. 17 shows a second alternate geometry for a purge cabinet.
Figure 16:
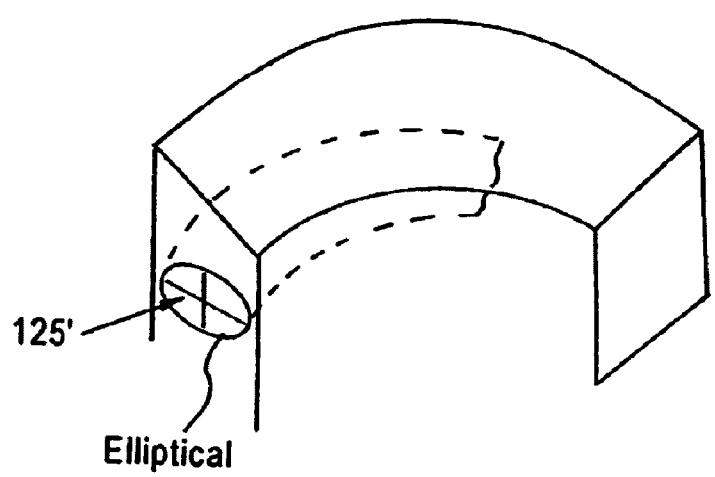
FIG. 16 shows an alternate geometry for a purge cabinet.

In order to anticipate and meet all future requirements, one embodiment of the present invention shows in FIGS. 16 and 17 that alternate configurations of the processing chamber or purge cabinet allow for different types of wafer processing as needed by the end user. FIG. 16 shows a first alternate purge cabinet 125' that is more traditionally cylindrical and alternately geared for placement of standard wafer boats. FIG. 17 illustrates a second alternate purge cabinet 125" that is more cubical in geometry which allows for horizontal wafer processing more easily as more stacked wafers will fit in the purge chamber 125".

Other advantages of one embodiment of the present invention include the ability of the TORO™ to process wafers at both low pressure (LPCVD) and positive pressure PP processes, with the appropriate gas and vacuum system.

Another optional feature may include that the purge cabinets are provided at each tube level but still can be combined for direct tube-to-tube transfers.

Figure 18:
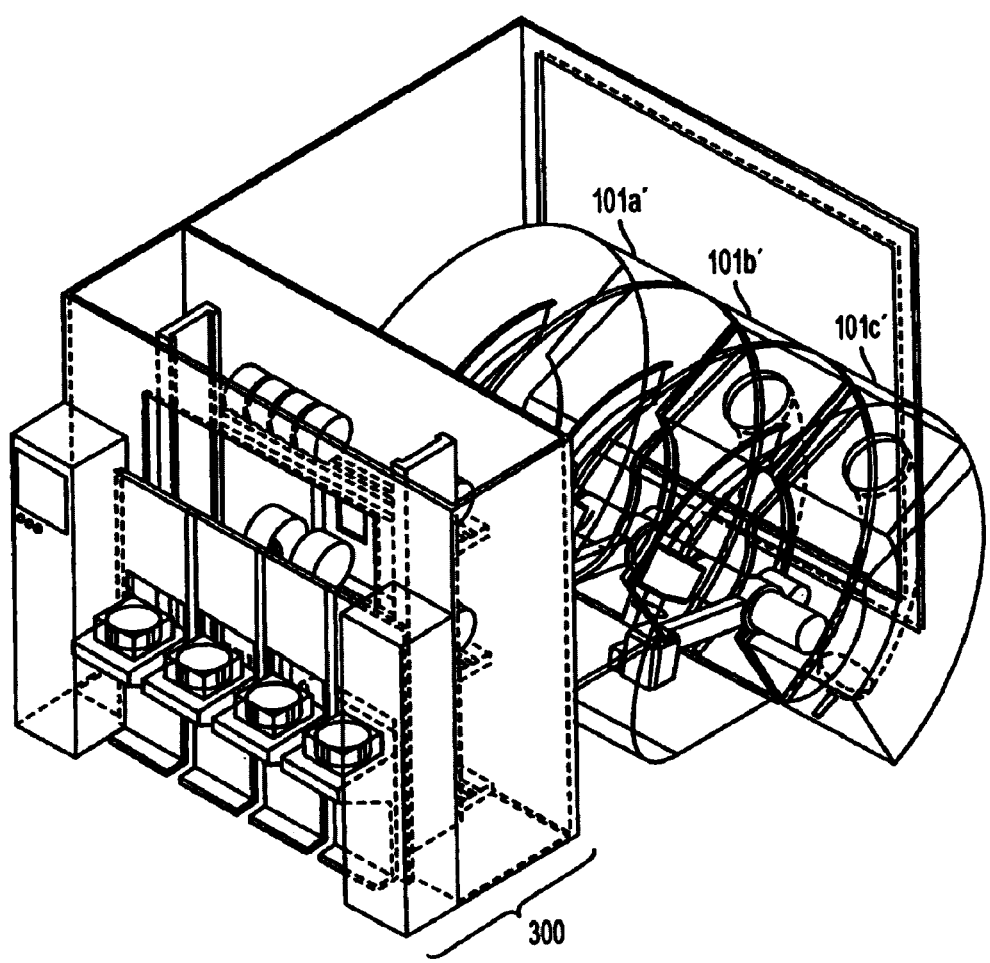
FIG. 18 shows one embodiment of the present invention implemented as a vertical processing oven.
Figure 19:
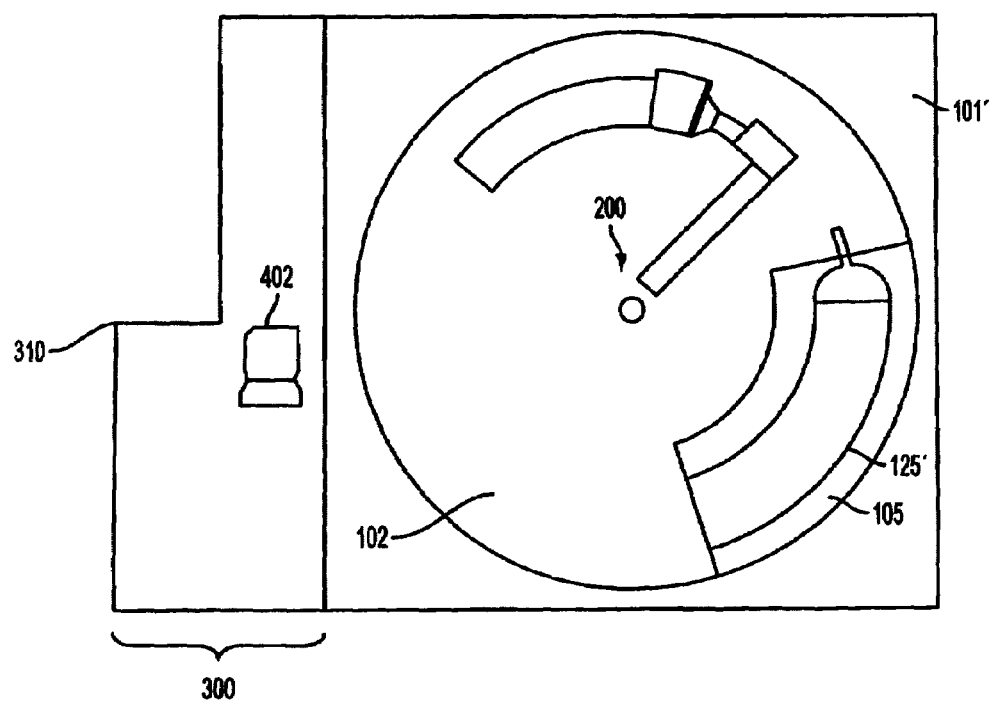
FIG. 19 shows the side view detail of the interior of one embodiment of the present invention implemented in a vertical embodiment.

The embodiments of the present invention are not limited to horizontal processing, even though the specialized interchangeable paddles 220" allow for alternate wafer processing, the TORO™ can be implemented in a vertical embodiment as well. FIG. 18 shows a side view of one embodiment of the present invention as it may be implemented as a vertical processing oven 101' and shown from the top in FIG. 19 in a side by side column of vertical processing ovens 101'(a), 101'(b), and 101(c).

Skilled artisans will recognize that one embodiment of the present invention can both take the place of and supplement other types of ovens. In some circumstances, the TORO™ can replace the vertical oven completely. TORO™ may also be a supplemental oven to the vertical oven. The above examples have been meant to be illustrative of specific features and embodiments and should not be considered as limitations on the scope of one embodiment of the present invention, which should be defined by the claims set forth below.

Having described my invention above, I claim:

1. An improved thermal processing system for a semiconductor wafer including:
   a first portion configured in a semi-circular shape;
   a second toroidal-shaped chamber portion comprising a purge cabinet for thermally processing wafers and volumetrically overlapping with said first portion at a first end, said purge cabinet being in gaseous contact with a gas source at second end;
   a wafer delivery and retrieval system located in the interior of said first portion, including a rotation arm rotating around a central axis located in said first portion, said rotation arm mechanically connected to a connector, said connector attaching itself to a paddle configured to hold a plurality of wafers for thermal processing in said chamber;
   wherein said connector is capable of releasing said paddle inside said chamber and pulling said paddle out of said chamber.

2. The thermal processing system as recited in claim 1, further comprising a thermal plug located at a back end of said paddle.

3. The thermal processing system as recited in claim 2, further comprising a scavenger door located at the back end of said thermal plug.

4. The thermal processing system as recited in claim 1, wherein said purge cabinet is toroidal.

5. The thermal processing system as recited in claim 1, wherein said purge cabinet is cubic.

6. The thermal processing system as recited in claim 1, wherein said wafers are vertically held on the paddle in a radial configuration.

7. The thermal processing system as recited in claim 1, wherein said system includes a vertical diffusion oven.

8. The thermal processing system as recited in claim 1, wherein said wafers are held on the paddle horizontally in multiple stacks in an arc.

9. The thermal processing system as recited in claim 8, wherein said wafers in each stack are supported by a structure included in said paddle.

10. The thermal processing system as recited in claim 1, wherein said second portion is between 60 and 130 degrees of arc.

11. The thermal processing system as recited in claim 1, wherein said first portion is between 120 and 200 degrees of arc.

12. The thermal processing system as recited in claim 1, wherein said first portion and said second portion volumetrically overlap each other between 5 and 20 degree of arc.

13. The thermal processing system as recited in claim 1, further including a wafer loading system, said wafer loading system including a loading arm configured to move a single wafer from a carrier to a secure position on said paddle.

14. The thermal processing system as recited in claim 13, wherein said loading arm can move at least 90 degrees in at least 2 different axes.

15. The thermal processing system as recited in claim 13, wherein said loading arm moves multiple wafers to a horizontal processing position on said paddle.

16. The thermal processing system as recited in claim 1, wherein said loading arm is programmable.

17. The thermal processing system as recited in claim 16, wherein said high-temperature paddle material is silicon carbide.

18. The system as recited in claim 1, wherein multiple said thermal processing systems are horizontally stacked on top of each other.

19. An improved thermal processing system for a semiconductor wafer including:
   a first portion configured in a semi-circular shape;
   a second toroidal-shaped chamber portion comprising a purge cabinet for thermally processing wafers and volumetrically overlapping with said first portion at a first end, said purge cabinet being in gaseous contact with a gas source at second end;
   a wafer delivery and retrieval system located in the interior of said first portion, including a rotation arm rotating around a central axis located in said first portion, said rotation arm mechanically connected to a connector, said connector attaching itself to a paddle;
   wherein said connector is capable of releasing said paddle inside said chamber and pulling said paddle out of said chamber,
   wherein said paddle is configured to hold a plurality of wafer boats.

20. The system as recited in claim 19, wherein said paddle is configured to hold specially configured wafer boats, such that said wafer boats hold said wafers in a radial configuration.

21. The system as recited in claim 19, where said paddle is configured to hold wafer boats, said wafer boats configured to hold wafers in the horizontal position during thermal processing.

* * * * *